(12) United States Patent
Takizawa et al.

(10) Patent No.: US 7,618,226 B2
(45) Date of Patent: Nov. 17, 2009

(54) SEMICONDUCTOR SUBSTRATE TRANSFER APPARATUS AND SEMICONDUCTOR SUBSTRATE PROCESSING APPARATUS EQUIPPED WITH THE SAME

(75) Inventors: Masahiro Takizawa, Tama (JP); Masaei Suwada, Tama (JP); Takashi Wada, Tama (JP)

(73) Assignee: ASM Japan K.K., Tokyo (JP)

( * ) Notice: Subject to any disclaimer, the term of this patent is extended or adjusted under 35 U.S.C. 154(b) by 42 days.

(21) Appl. No.: 11/445,035

(22) Filed: Jun. 1, 2006

(65) Prior Publication Data

US 2007/0142962 A1    Jun. 21, 2007

(30) Foreign Application Priority Data

Jun. 24, 2005    (JP)    .............................. 2005-184365

(51) Int. Cl.
B65B 69/00    (2006.01)

(52) U.S. Cl. .................................. 414/416.08; 414/217

(58) Field of Classification Search .............. 414/744.1, 414/416.08, 217.1, 411, 939, 940
See application file for complete search history.

(56) References Cited

U.S. PATENT DOCUMENTS

| | | | | |
|---|---|---|---|---|
| 5,975,834 A | * | 11/1999 | Ogawa et al. ............. | 414/744.5 |
| 6,395,094 B1 | * | 5/2002 | Tanaka et al. ................ | 118/719 |
| 6,435,799 B2 | | 8/2002 | Goodwin et al. | |
| 6,450,755 B1 | * | 9/2002 | Cameron et al. ....... | 414/416.08 |
| 6,481,956 B1 | * | 11/2002 | Hofmeister .................. | 414/806 |
| 6,485,250 B2 | * | 11/2002 | Hofmeister .............. | 414/744.1 |
| 6,585,478 B1 | | 7/2003 | Wood et al. | |
| 6,669,434 B2 | * | 12/2003 | Namba et al. ............. | 414/744.5 |
| 6,696,367 B1 | | 2/2004 | Aggarwal et al. | |
| 6,729,824 B2 | * | 5/2004 | Lei et al. ..................... | 414/217 |
| 6,748,293 B1 | | 6/2004 | Larsen | |
| 6,852,007 B1 | | 2/2005 | Gonzalez-Martin et al. | |
| 6,918,731 B2 | | 7/2005 | Talmer | |
| 7,140,655 B2 | * | 11/2006 | Kesil et al. ................... | 294/104 |
| 2005/0118009 A1 | * | 6/2005 | van der Meulen ........ | 414/744.1 |
| 2005/0118010 A1 | * | 6/2005 | Ogawa et al. ............. | 414/744.1 |
| 2006/0263177 A1 | * | 11/2006 | Meulen ....................... | 414/217 |

FOREIGN PATENT DOCUMENTS

| | | |
|---|---|---|
| JP | 07-106402 | 4/1995 |
| JP | 2001-50159 A | 2/2001 |
| WO | WO 98/08518 | 3/1998 |

* cited by examiner

*Primary Examiner*—Saúl J Rodríguez
*Assistant Examiner*—Joshua I Rudawitz
(74) *Attorney, Agent, or Firm*—Knobbe Martens Olson & Bear LLP

(57) ABSTRACT

A semiconductor substrate transfer apparatus for transferring semiconductor substrates from a first container to a second container, includes: multiple end effectors; at least one robot arm with which the multiple end effectors are independently rotatably joined; and a controller storing software including instructions to judge which end effector or end effectors in the multiple end effectors are to be selected based on a distribution status of substrates stored in the first and second containers and to rotate the selected end effector(s) for unloading a substrate or substrates from the first container and loading the substrate or substrates to the second container.

18 Claims, 5 Drawing Sheets

SEMICONDUCTOR SUBSTRATE TRANSFER APPARATUS AND SEMICONDUCTOR SUBSTRATE PROCESSING APPARATUS EQUIPPED WITH THE SAME

BACKGROUND OF THE INVENTION

1. Field of the Invention

The present invention generally relates to a semiconductor substrate processing apparatus; particularly to a semiconductor substrate transfer apparatus for carrying in/out a semiconductor wafer between a storing container and a processing container.

2. Description of the Related Art

In a semiconductor processing apparatus, a semiconductor wafer normally has to be transferred between plural separate containers inside the apparatus in order to deliver the wafer from a storing container to a processing container in which a target process is performed. As this type of mechanism for transferring a semiconductor wafer, a transfer robot is widely known. In conventional semiconductor processing apparatuses, there are many different types of transfer robots having various shapes and motion forms in order to meet the apparatuses' purposes and requirements.

In recent years, in semiconductor production, a throughput of a semiconductor processing apparatus (the number of wafers processed per unit time) has become a matter of great concern. In order to increase a throughput, a transfer robot having a mechanism of transferring plural wafers all at once has been realized. This method transfers plural pieces being held on a portion of a robot for holding a wafer, which is called an end effector, at one time by adjusting a width of the end effector to a slot interval of a storing container and placing plural wafers on the end effector in a perpendicular direction. This type of transfer robot is disclosed in, for example, Japanese National Phase Publication No. 2001-501597 (Patent Reference 1)

In this type of apparatus, if a slot interval of a wafer-storing container and a slot interval of a container to which a wafer is transferred differ, it becomes necessary to add a mechanism of adjusting an interval in a perpendicular direction of each end effector while wafers are being transferred.

As another type of transfer robot, there is a type whose end effector holds only one wafer but which also has a different independent end effector, in which a motion to unload a wafer from a storing container using one end effector and a motion to load a wafer which was unloaded from the storing container prior to being loaded using the other end effector are performed simultaneously. This type of transfer robot is called a dual-arm robot and can realize a throughput twice the one realized by a single-arm robot.

Furthermore, as still another type of transfer robot, a type combining the above-mentioned method of transferring plural wafers all at once and the dual-arm method is disclosed in, for example, Japanese Patent Laid-open No. 1995-106402 (Patent Reference 2).

SUMMARY OF THE INVENTION

Although the transfer robot combining the above-mentioned method of transferring plural wafers all at once and the dual-arm method is effective, it may not realize a satisfactory transfer throughput depending on conditions.

For example, if there is a slot without a wafer in a wafer-storing container, the number of wafers transferable at one time decreases, thereby lowering a transfer throughput. Additionally, in the case of the method of transferring plural wafers all at once, if the number of wafers stored in a wafer-storing container is not a multiple of the number of wafers transferable all at once, a transfer throughput lowered because a fraction remains. Because of this, there was a limit to the number of wafers stored in the storing container.

The present invention was achieved in view of the above-mentioned problems, and an object of at least one embodiment of the present invention is to provide a transfer mechanism for transferring a semiconductor wafer without lowering a transfer throughput under all conditions including a case in which an empty slot without a wafer exists in a wafer-storing container, or a case in which the number of wafers stored in a wafer-storing container is not a multiple of the number of wafers transferable all at once and so forth.

Another object of at least one embodiment of the present invention is to provide an improved semiconductor processing apparatus so as to improve a throughput by equipping it with the above-mentioned transfer robot.

In an aspect wherein one or more of the problems described above can be resolved, the present invention provides a semiconductor substrate transfer apparatus for transferring semiconductor substrates from a first container to a second container, comprising: (i) multiple end effectors for unloading substrates from the first container and loading the substrates to the second container, one of said multiple end effectors being configured to hold at least one substrate, another of said multiple end effectors being configured to hold more substrates than the one of said multiple end effectors; (ii) at least one robot arm for moving the multiple end effectors from the first container to the second container, wherein the multiple end effectors are joined with the arm and independently rotatable with respect to the arm; and (iii) a controller storing software including instructions to judge which end effector or end effectors in the multiple end effectors are to be selected based on a distribution status of substrates stored in the first and second containers and to rotate the selected end effector(s) for unloading a substrate or substrates from the first container and loading the substrate or substrates to the second container.

The above aspect includes, but is not limited to, the following embodiments:

The multiple end effectors may be two end effectors. The one of the multiple end effectors may be configured to hold one substrate, and the other of the multiple end effectors may be configured to hold two substrates.

The instructions included in the software may instruct the selected end effector(s) to rotate for unloading a substrate or substrates from the first container and may instruct the non-selected end effector(s), if any, to be retracted so as not to contact the substrate or substrate(s).

The distribution status may include an occupancy status of substrate slots of the first container and an empty status of substrate slots of the second container. The software may include the instructions to judge which end effector or end effectors in the multiple end effectors are to be selected based on the distribution status of substrates, wherein the end effector(s) is/are selected which can simultaneously hold a maximum number of substrates which is the same as or smaller than the number of consecutive empty slots of the second container and the number of consecutive occupied slots of the first container.

The semiconductor substrate transfer apparatus may further comprise a sensor device for sensing an occupancy status of slots of the first container, which is used as the distribution status by the software.

The semiconductor substrate transfer apparatus may be configured to be disposed between a front opening unified pod (FOUP) as the first container and an in-out chamber (IOC) as the second container, wherein unprocessed substrates are transferred from the FOUP to the IOC.

The semiconductor substrate transfer apparatus may be configured to be disposed between an in-out chamber (IOC) as the first container and a front opening unified pod (FOUP) as the second container, wherein processed substrates are transferred from the IOC to the FOUP.

The maximum number of substrates which can be held simultaneously by the multiple end effectors may be a factor of the number of slots provided in the first container and/or the second container.

The at least one robot arm may comprise a first arm and a second arm rotatably joined with the first arm, wherein the multiple end effectors are rotatably joined with the second arm, and the first arm has a support axis and is rotatably fixed to a base.

In all of the aforesaid embodiments, any element used in an embodiment can interchangeably or additionally be used in another embodiment unless such a replacement or addition is not feasible or causes adverse effect.

In another aspect wherein one or more of the problems described above can be resolved, the present invention provides a semiconductor substrate transfer system comprising: (a) at least one front opening unified pod (FOUP) for storing substrates; (b) at least one in-out chamber (IOC) for storing substrates; and (c) a semiconductor substrate transfer apparatus disposed between the front opening unified pod and the in-out chamber, for transferring substrates between the front opening unified pod and the in-out chamber, said semiconductor substrate transfer apparatus comprising: (i) multiple end effectors for unloading substrates from the front opening unified pod and loading the substrates to the in-out chamber and for unloading substrates from the in-out chamber and loading the substrates to the front opening unified pod, one of said multiple end effectors being configured to hold at least one substrate, another of said multiple end effectors being configured to hold more substrates than the one of said multiple end effectors; (ii) at least one robot arm for moving the multiple end effectors between the front opening unified pod and the in-out chamber, wherein the multiple end effectors are joined with the arm and independently rotatable with respect to the arm; and (iii) a controller storing software including instructions to judge which end effector or end effectors in the multiple end effectors are to be selected based on a distribution status of substrates stored in the front opening unified pod and the in-out chamber and to rotate the selected end effector(s) for unloading a substrate or substrates from the front opening unified pod and loading the substrate or substrates to the in-out chamber or for unloading a substrate or substrates from the in-out chamber and loading the substrate or substrates to the front opening unified pod.

In the above aspect, any element used in any of the aforesaid embodiments can also be used singly or in any combination.

In still another aspect wherein one or more of the problems described above can be resolved, the present invention provides a semiconductor substrate processing apparatus comprising: (a) at least one front opening unified pod (FOUP) for storing substrates; (b) at least one in-out chamber (IOC) for storing substrates; (c) a semiconductor substrate transfer apparatus disposed between the front opening unified pod and the in-out chamber, for transferring substrates between the front opening unified pod and the in-out chamber, said semiconductor substrate transfer apparatus comprising: (i) multiple end effectors for unloading substrates from the front opening unified pod and loading the substrates to the in-out chamber and for unloading substrates from the in-out chamber and loading the substrates to the front opening unified pod, one of said multiple end effectors being configured to hold at least one substrate, another of said multiple end effectors being configured to hold more substrates than the one of said multiple end effectors; (ii) at least one robot arm for moving the multiple end effectors between the front opening unified pod and the in-out chamber, wherein the multiple end effectors are joined with the arm and independently rotatable with respect to the arm; and (iii) a controller storing software including instructions to judge which end effector or end effectors in the multiple end effectors are to be selected based on a distribution status of substrates stored in the front opening unified pod and the in-out chamber and to rotate the selected end effector(s) for unloading a substrate or substrates from the front opening unified pod and loading the substrate or substrates to the in-out chamber or for unloading a substrate or substrates from the in-out chamber and loading the substrate or substrates to the front opening unified pod; (d) at least one reaction chamber for processing substrates; and (e) a vacuum robot disposed between the in-out chamber and the reaction chamber.

In the above, the maximum number of substrates which can be held simultaneously by the multiple end effectors may be a factor of the number of slots provided in the front opening unified pod and/or the in-out chamber. The maximum number of substrates which can be held simultaneously by the multiple end effectors may be a factor of the number of slots provided in the in-out chamber and the number of the reaction chambers.

In the above aspect, any element used in any of the aforesaid embodiments can also be used singly or in any combination.

In yet another aspect wherein one or more of the problems described above can be resolved, the present invention provides a method for transferring semiconductor substrates from a first container to a second container by multiple end effectors, one of said multiple end effectors being configured to hold at least one substrate, another of said multiple end effectors being configured to hold more substrates than the one of said multiple end effectors, said method comprising the steps of: (A) judging which end effector or end effectors in the multiple end effectors are to be selected based on a distribution status of substrates stored in the first and second containers; and (B) rotating the selected end effector(s) to unload a substrate or substrates from the first container and load the substrate or substrates to the second container.

The above aspect includes, but is not limited to, the following embodiments.

The multiple end effectors may be two end effectors. The one of the multiple end effectors may be configured to hold one substrate, and the other of the multiple end effectors may be configured to hold two substrates.

The rotating step may further comprise retracting the non-selected end effector(s), if any, not to contact the substrate or substrate(s).

In the judging step, the distribution status may include an occupancy status of substrate slots of the first container and an empty status of substrate slots of the second container. The judging step may comprise selecting the end effector(s) which can simultaneously hold a maximum number of substrates which is the same as or smaller than the number of consecutive empty slots of the second container and the number of consecutive occupied slots of the first container.

The method may further comprise obtaining, as the distribution status, an occupancy status of substrate slots of the first container and an empty status of substrate slots of the second container. The occupancy status and the empty status may be obtained by scanning each slot by a laser beam sensor.

In all of the aforesaid embodiments and aspects, any element used in an embodiment or aspect can interchangeably or additionally be used in another embodiment or aspect unless such a replacement or addition is not feasible or causes adverse effect.

For purposes of summarizing the invention and the advantages achieved over the related art, certain objects and advantages of the invention have been described above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further aspects, features and advantages of this invention will become apparent from the detailed description of the preferred embodiments which follow.

BRIEF DESCRIPTION OF THE DRAWINGS

These and other features of this invention will now be described with reference to the drawings of preferred embodiments-which are intended to illustrate and not to limit the invention.

In FIG. 1(A), an end effector 4 holding one wafer is in use for transferring one wafer. In FIG. 1(B), an end effector 5 holding two wafers is in use for transferring two wafers. In FIG. 1(C), both the end effectors 4, 5 are in use for transferring three wafers.

FIG. 6(A) is a side cross sectional view, FIG. 6(B) is a top cross sectional view, and FIG. 6(C) is a perspective view.

DETAILED DESCRIPTION OF THE PREFERRED EMBODIMENT

Figures 1A, 1B, 1C:
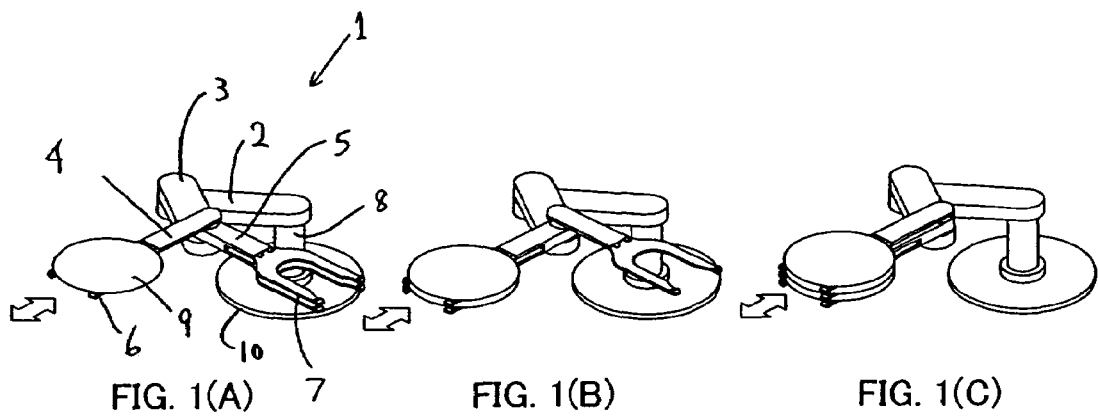
FIGS. 1(A)-1(C) show operation of a substrate transfer apparatus according to an embodiment of the present invention.

The present invention will be explained with reference to preferred embodiments and drawings. However, the preferred embodiments and drawings are not intended to limit the present invention.

In an embodiment of the present invention, a semiconductor substrate transfer apparatus comprises at least one arm and N (N is any integer of two or more) end effectors rotatably joined with the arm, each of which end effector holds at least one semiconductor substrate, which is characterized in that at the start of a substrate transfer process, at least one desired end effector is selected from N end effectors according to a substrate distribution status in a transfer origin and an empty slot status in a transfer destination, a selected end effector and an unselected end effector rotate independently of each other in respect to the arm, and a semiconductor substrate is transferred by the selected end effector.

Preferably, N equals 2 and a first end effector holds one semiconductor substrate, and a second end effector holds two semiconductor substrates.

Specifically, when two semiconductor substrates are transferred, the first effector rotates and retracts; when one semiconductor substrate is transferred, the second end effector rotates and retracts.

In another embodiment of the present invention, a program for controlling a semiconductor substrate transfer apparatus comprising at least one arm and N (N is any integer of two or more) end effectors rotatably joined with the arm, each of which holds at least one semiconductor substrate, executes the following tasks:

(1) In response to a command notifying of a substrate distribution status in a transfer origin, an evaluation result of whether M (M is a maximum number of semiconductor substrates transferable by N end effectors at a time) or more consecutive empty slots exist in a transfer destination or not is outputted, (2) If M or more consecutive empty slots exist in the transfer destination from the result outputted in (1), an evaluation result of whether semiconductor substrates exist in M or more consecutive slots in the transfer origin or not is outputted, (3) If M or more consecutive empty slots do not exist in the transfer destination from the result outputted in (1), an evaluation result of whether M−1 consecutive empty slots exist in the transfer destination or not is outputted, (4) If semiconductor substrates exist in M or more consecutive slots in the transfer origin from the result outputted in (2), an instruction to select an end effector for M−1 pieces and an end effector for a single piece and transfer M semiconductor substrates to the slots in the transfer destination using the selected end effectors is outputted, (5) If semiconductor substrates do not exist in M or more consecutive slots in the transfer origin from the result outputted in (2), or if M−1 consecutive empty slots exist in the transfer destination from the result outputted in (3), an evaluation result of whether semiconductor substrates exist in M−1 consecutive slots in the transfer origin or not is outputted, (6) If M−1 consecutive empty slots do not exist in the transfer destination from the result outputted in (3), an evaluation result of whether one empty slot exists in the transfer origin or not is outputted, (7) If semiconductor substrates exist in M−1 consecutive slots in the transfer origin from the result outputted in (5), an instruction to select an end effector for M−1 pieces and rotate and retract end effectors other than the selected is outputted, and an instruction to transfer M−1 semiconductor substrates to the slots in the transfer destination using the end effector for M−1 pieces is outputted, (8) If semiconductor substrates do not exist in M−1 consecutive slots in the transfer origin from the result outputted in (5), or if one empty slot exists in the transfer destination from the result outputted in (6), an evaluation result of whether one empty slot exists in the transfer origin or not is outputted, (9) If one semiconductor substrate exists in the transfer origin from the result outputted in (8), an instruction to select an end effector for a single piece and rotate and retract the other end effectors is outputted, and an instruction to transfer one semiconductor substrate to the slot in the transfer destination using the selected end effector for a single piece is outputted.

A semiconductor processing apparatus according to still another embodiment of the present invention comprises at least one reaction chamber, a load lock chamber, a wafer I/O container disposed inside the load lock chamber, a wafer-storing container for storing semiconductor substrates, the above-mentioned substrate transfer apparatus, a laser sensor for evaluating a semiconductor substrate distribution status inside the wafer-storing container, and a control means for executing the above-mentioned program.

Preferably, the number of reaction chambers and the number of semiconductor wafers which can be stored in the wafer I/O container respectively are a multiple of a maximum number of wafers transferable when all end effectors are used.

A semiconductor substrate transfer system according to yet another embodiment of the present invention comprises: (i) a substrate transfer apparatus comprising a first end effector holding one semiconductor substrate, a second end effector holding M−1 (M is a maximum number of semiconductor substrates transferable by N end effectors at a time) semiconductor substrates, a first arm supporting the first end effector and the second end effector, a rotating mechanism, and a second arm one end of which is rotatably joined with the first arm and the other end of which is connected with the rotating mechanism, (ii) an evaluation apparatus provided inside a mounting stage of the storing container for storing semiconductor substrates for evaluating a semiconductor substrate distribution status inside the storing container by a laser emitting element and a light receiving element and outputting an evaluation result, and (iii) a control means having a processor and memory and for controlling motions of the first end effector and the second end effector; and is characterized in that motions of the first end effector and the second end effector are controlled by execution of a program stored in the above memory, and that the control is to select at least one end effector to be used based on evaluation information outputted from the evaluation apparatus and to activate the rotating mechanism so as to rotate and retract an unselected end effector in respect to the first arm and independently of the selected end effector.

The present invention is described in detail below with reference to drawings attached. FIG. 1 shows a preferred embodiment of a substrate transfer apparatus according to the present invention. The substrate transfer apparatus also includes a base 10. As described below, the base 10 can move in parallel to a substrate storing container. A support axis 8 is fixed in the center of the base 10 (and is movable vertically). The support axis 8 can move up and down. A first driving arm 2 is rotatably joined with an upper end of the base 10. The second driving arm 3 is rotatably joined with a tip of the first driving arm 2. A first end effector 4 and a second end effector 5 are rotatably joined with a tip of the second driving arm 3. The first end effector 4 has a first holding portion 6 for holding a semiconductor substrate 9. In this embodiment of the present invention, the first holding portion 6 is adapted to hold only one semiconductor substrate 9. The second end effector 5 has a second holding portion 7 for holding semiconductor substrates. In the preferred embodiment, the second holding portion 7 is adapted to able to hold two semiconductor substrates. In another embodiment, it is possible to configure the second holding portion to hold three or more semiconductor substrates.

The first end effector 4 and the second end effector 5 can rotate/move independently of each other by a rotating mechanism (not shown). Each end effector is composed of ceramics or carbon fiber, thereby suppressing particle generation by a rotational motion to the minimum. As a material used for the end effector, carbon fiber is preferable. If ceramics is used, aluminum oxide ($Al_2O_3$) or silicon carbide (SiC) is preferable.

As described above, in the preferred embodiment, the substrate transfer apparatus according to the present invention is called a dual-arm robot because it has two end effectors. In another embodiment, however, the number of end effectors can be set up at any integer of three or more.

Transfer motions of the substrate transfer apparatus according to an embodiment of the present invention are described. FIG. 1(a) shows motions of the substrate transfer apparatus when only one semiconductor substrate stored in the storing container is transferred. First, the second end effector 5 is moved in a rotational direction and retracted to the opposite side of the storing container. Subsequently, the first end effector 4 is moved in a rotational direction to the side of the storing container; the first holding portion 6 is extended in a storing container direction by the driving arms 2, 3, and only one semiconductor substrate 9 in a given position inside the storing container is taken out and held by the first holding portion 6.

FIG. 1(b) shows motions of the substrate transfer apparatus when two semiconductor substrates stored in the storing container are transferred. First, the first end effector 4 is moved in a rotational direction and retracted to the opposite side of the storing container. Subsequently, the second end effector 5 is moved in a rotational direction to the side of the storing container; the second holding portion 7 is extended in a storing container direction by the driving arms 2, 3, and two semiconductor substrates in a given position inside the storing container are taken out and held by the second holding portion 7.

FIG. 1(c) shows motions of the substrate transfer apparatus when three semiconductor substrates stored in the storing container are transferred. First, the first end effector 4 and the second end effector 5 are moved in a rotational direction to the side of the storing container. Subsequently, the first holding portion 6 and the second holding portion 7 are extended in a storing container direction by the driving arms 2, 3, and three semiconductor substrates in a given position inside the storing container are taken out and held.

Figure 2:
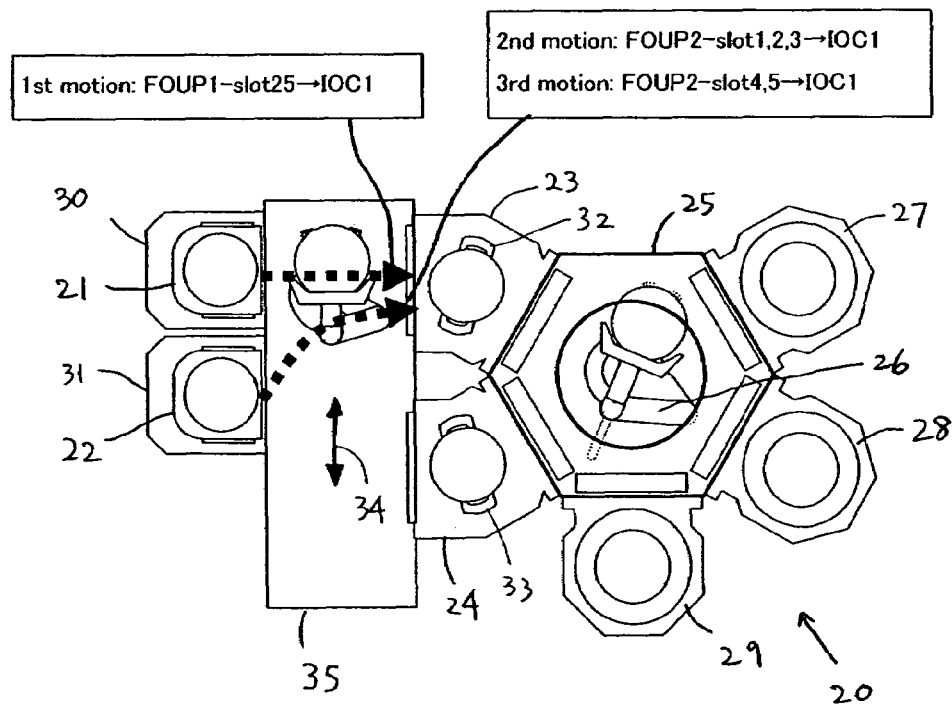
FIG. 2 is a schematic plane view of a semiconductor processing apparatus equipped with the substrate transfer apparatus according to an embodiment of the present invention.

An embodiment in which the substrate transfer apparatus according to an embodiment of the present invention is actually installed in a single-wafer-processing semiconductor processing apparatus is described. FIG. 2 is a schematic plane view of a preferred embodiment of a semiconductor processing apparatus equipped with the substrate transfer apparatus according to the present invention. A semiconductor processing apparatus 20 comprises a substrate transfer chamber 25, plural reaction chambers 27, 28, 29 joined with the substrate transfer chamber 25, and in-out chambers (IOC) (also referred to as load lock chambers or wafer I/O containers) 23 (IOC1), 24 (IOC2) joined with the substrate transfer chamber 25. Slots 32, 33 are installed respectively inside the load lock chambers 23, 24. A substrate transfer robot (also referred to as a vacuum robot) 26 is installed inside the substrate transfer chamber 25 and transfers wafers inside the wafer load lock chambers 23, 24 to respective reaction chambers. This substrate transfer robot 26 is normally a single-arm robot; a dual-arm robot can also be used.

A transfer chamber 35 with an atmospheric pressure is connected with the load lock chambers 23, 24. Inside the transfer chamber 35, a substrate transfer apparatus (also referred to as an atmospheric robot) 1 according to an embodiment of the present invention is installed. Inside the transfer chamber 35, the substrate transfer apparatus 1 according to this embodiment of the present invention can move in parallel in a direction of arrows 34. Preferably, the substrate transfer apparatus is a dual-arm robot. Storing container mounting stages 30, 31 are connected in parallel with the transfer chamber 35 on the opposite side of the load lock chambers 23, 24. Inside the mounting stages 30, 31, wafer-storing containers (also referred to as front opening unified pod (FOUP)) 21(FOUP1), 22 (FOUP2) are respectively loaded. In the embodiment shown in FIG. 2, the number of the mounting stages is two; if desired, it is possible to provide more mounting stages. The wafer-storing containers 21, 22 comprise plural slots storing a semiconductor substrate at a time. The number of slots is arbitrary.

A sequence of substrate transfer motion is described. Here, for convenience of explanation, it is assumed that the number of slots in the wafer-storing containers 21, 22 is 25 and the number of slots in each of the load lock chambers 23, 24 is 6.

Semiconductor substrates inside the wafer-storing container 21 are transferred to the load lock chambers 23 (IOC1), 24 (IOC2). As described above, the substrate transfer apparatus 1 according to this embodiment of the present invention can transfer a maximum of three semiconductor wafers per transfer motion. Consequently, if the transfer motion is repeated, one wafer remains in the $25^{th}$ slot in the wafer-storing container 21 (FOUP1). Here, in the substrate transfer apparatus 1 according to this embodiment of the present invention, the second end effector 5 is rotated and retracted; further, the first end effector 4 is moved in a rotational direction, the remaining wafer in the $25^{th}$ slot in the wafer-storing container 21 (FOUP1) is held by the first wafer holding portion 6 of the first end effector 4, and the wafer is transferred to the first slot in the load lock chamber 23 (IOC1) (the $1^{st}$ motion in FIG. 2).

Subsequently, the retracted second end effector 5 is returned to its original position and wafer transfer is switched over to transfer from the wafer-storing container 22 (FOUP2). Three wafers in the $1^{st}$, $2^{nd}$, and $3^{rd}$ slots in the wafer-storing container 22 (FOUP2) are respectively transferred to the $2^{nd}$, $3^{rd}$, and $4^{th}$ slots in the load lock chamber 23 (IOC1) simultaneously by the substrate transfer apparatus 1 according to this embodiment of the present invention (the 2nd motion in FIG. 2). The first end effector 4 in the substrate transfer apparatus 1 is rotated and retracted; the second end effector 5 is moved in a rotational direction; two wafers in $4^{th}$ and $5^{th}$ slots in the wafer-storing container 22 (FOUP2) are held by the second holding portion 7 of the second end effector 5; the wafers are respectively transferred to the remaining $5^{th}$ and $6^{th}$ slots in the load lock chamber 32 (IOC1) (the $3^{rd}$ motion in FIG. 2).

In this way, when a wafer-storing container is switched, it is possible to continue the wafer transfer smoothly by appropriately selecting an end effector to be used of the dual-arm robot according to an embodiment of the present invention, thereby improving throughput.

When the number of slots in the load lock chambers 23 (IOC1), 24 (IOC2) and the number of reaction chambers are a multiple of a maximum number of pieces transferable in the substrate transfer apparatus 1, the highest throughput can be obtained. Consequently, it is preferable to determine the number of slots and the number of reaction chambers so as to let such multiples be selected. The number of reaction chambers, however, is often determined in advance from an apparatus installation area and costs involved. In that case, by appropriately adjusting the number of slots in the load lock chamber (the wafer I/O container) and a maximum number of pieces transferable at a time, it is possible to achieve a maximum transfer throughput.

Figure 3:
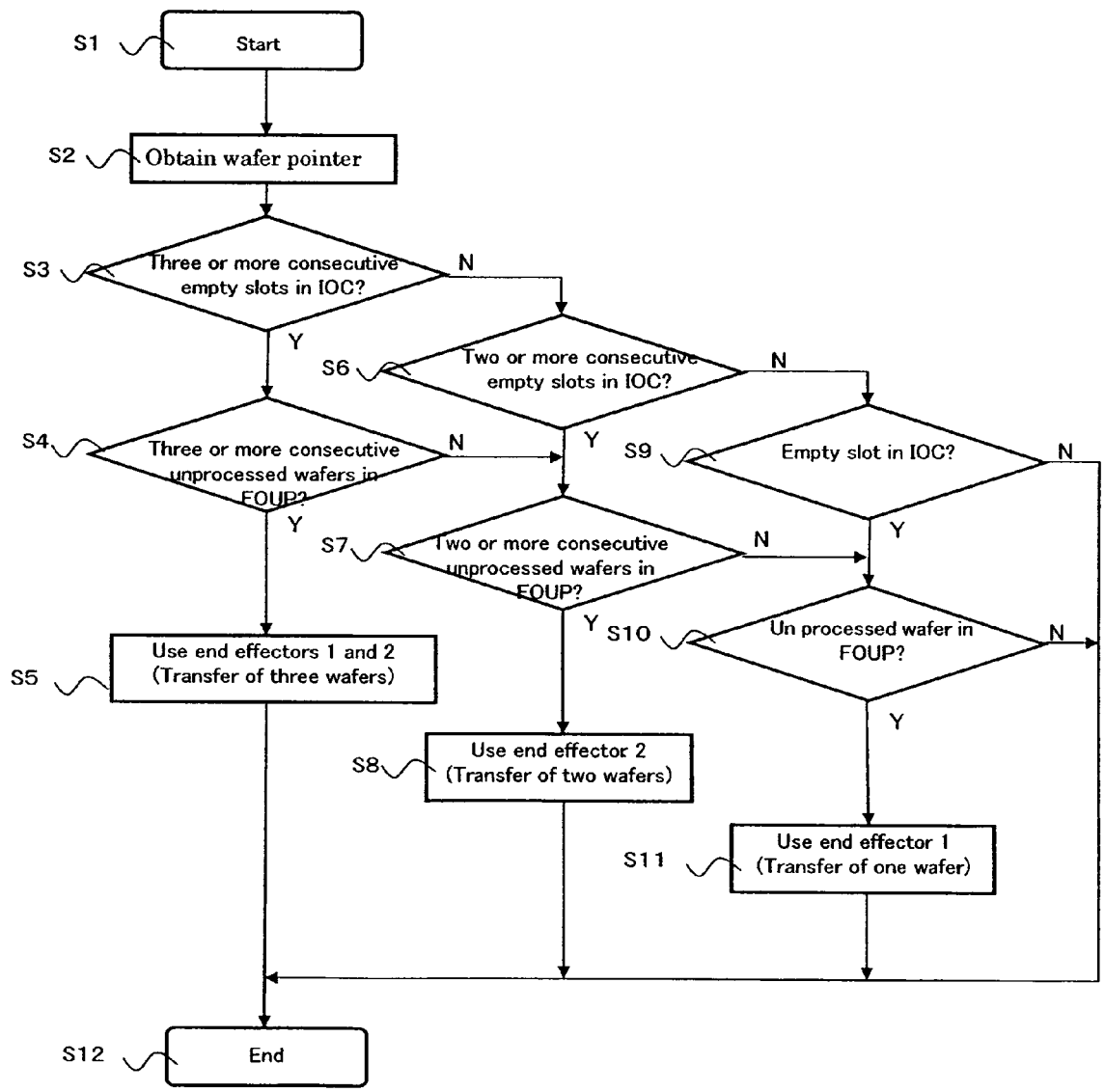
FIG. 3 is a flowchart of a control process for transferring a wafer from a wafer-storing container to a wafer I/O container using the substrate transfer apparatus according to an embodiment of the present invention.
Figure 4:
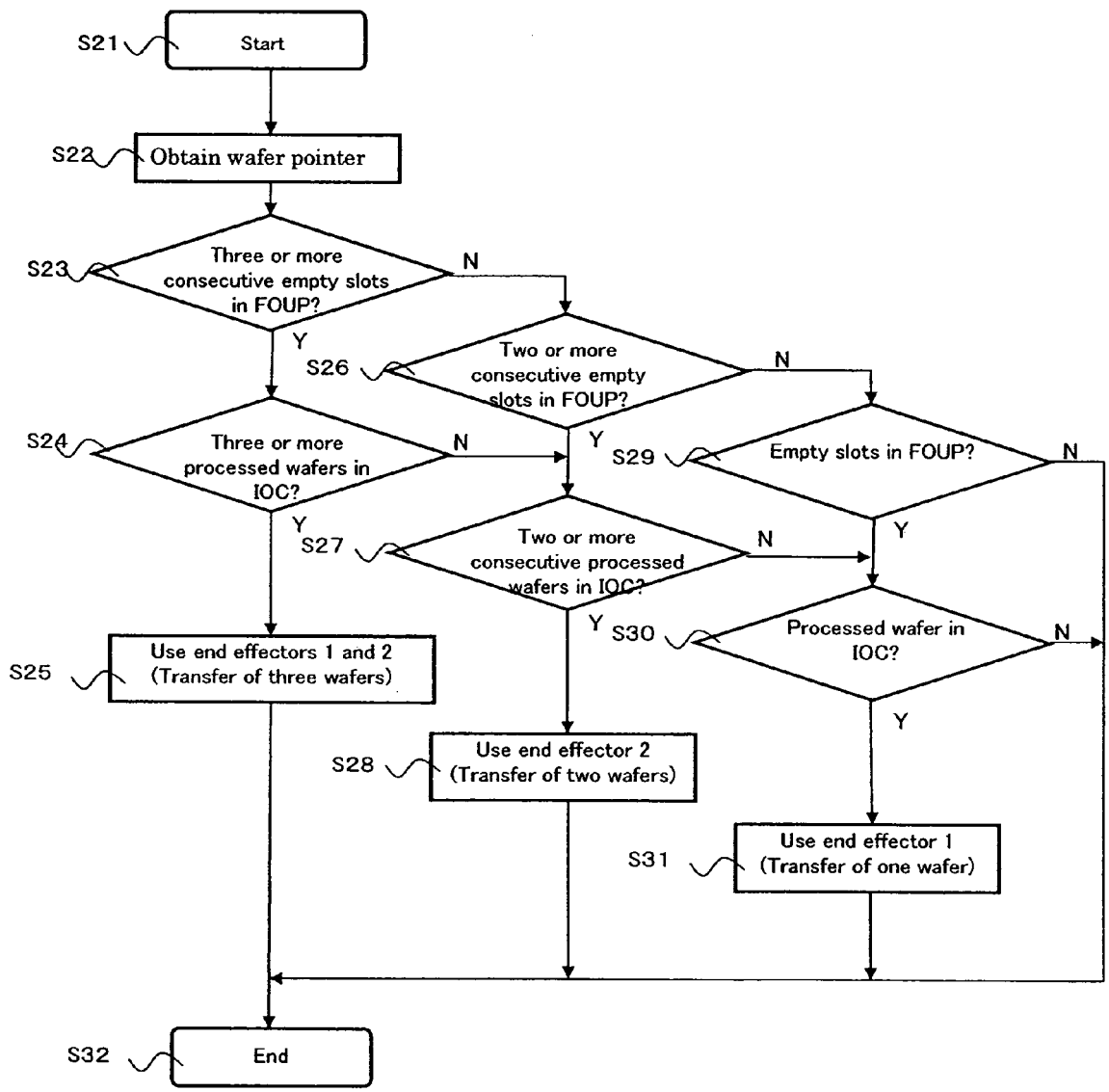
FIG. 4 is a flowchart of a control process for transferring a wafer from a wafer I/O container to a wafer-storing container using the substrate transfer apparatus according to an embodiment of the present invention.

Motion of the substrate transfer apparatus 1 like the above is automatically controlled by a control means (not shown) such as a computer program. FIGS. 3 and 4 respectively show a flowchart of a transfer motion control program. Additionally, this is a software program called from a main program controlling a semiconductor processing apparatus 20 every time wafer transfer is performed using the substrate transfer apparatus 1.

The software programs shown in FIGS. 3 and 4 respectively comprise 12 steps. FIG. 3 is a flowchart of a software program transferring a wafer from a wafer-storing container to a wafer I/O container. The process is started from Step 1.

In Step 2, a wafer pointer is obtained. Here, the wafer pointer means the lowest wafer slot position of unprocessed wafer slot positions in the wafer-storing container. This information can be obtained from the main control program. Specifically, from wafer mapping by a laser sensor comprising a laser emitting element and a laser receiving element, an evaluation on whether a wafer exists in each slot in the wafer-storing container or not is performed. Based on this evaluation information, the lowest slot position of unprocessed wafers is obtained. For example, the lowest slot position of unprocessed wafers at the start of a wafer lot process is 1.

In Step 3, slot information of the wafer I/O container, which is a transfer destination, is confirmed, and whether three or more consecutive empty slots exist or not is evaluated. If three or more consecutive slots exist, the process advances to Step 4; if not, the process advances to Step 6.

In Step 4, from the position information of a wafer pointer obtained in Step 2, the slot information of unprocessed wafer is confirmed, and whether or not unprocessed wafers exist in three or more consecutive slots is evaluated. If unprocessed wafers exist in three or more consecutive slots in the wafer-storing container, the process advances to Step 5; if not, the process advances to Step 7. In Step 5, three wafers are transferred simultaneously using both of two end effectors in the semiconductor transfer apparatus. Subsequently, the process advances to Step 12, and the process ends.

In Step 6, whether or not two consecutive empty slots exist in the wafer I/O container is evaluated. If the empty slots exist, the process advances to Step 7; if not, the process advances to Step 9. In Step 7, whether or not two consecutive unprocessed wafers exist is evaluated from the slot position information of the wafer pointer of the wafer-storing container. If two consecutive unprocessed wafers exist, the process advances to Step 8; if not, the process advances to Step 10. In Step 8, using only the end effector 5 in the substrate transfer apparatus 1, two wafers are transferred simultaneously. The process advances to Step 12, and the process ends.

In Step 9, whether or not an empty slot exists in the wafer I/O container is evaluated. If an empty slot exists, the process advances to Step 10; if not, the process advances to Step 12 and the process ends.

In Step 10, whether or not an unprocessed wafer exists in a position indicated by the wafer pointer of the wafer-storing container is evaluated. If an unprocessed wafer exists, the process advances to Step 11; if not, the process advances to Step 12 and the process ends.

In Step 11, one wafer is transferred using only the end effector 4 in the substrate transfer apparatus. The process advances to Step 12 and the process ends.

FIG. 4 is a flowchart of a software program for returning a processed wafer from the wafer I/O container inside the load lock chamber to the wafer-storing container. Except that containers of the transfer destination and the transfer origin are switched, a control evaluation process is the same as that shown in FIG. 3.

The substrate transfer apparatus according to an embodiment of the present invention has two end effectors completely independently of each other; one end effector holds one wafer and the other end effector holds plural wafers. In a semiconductor processing apparatus equipped with this type of substrate transfer apparatus, even when no wafer exists in a wafer-storing container, or the number of wafers stored in the storing container is not a multiple of the number of wafers transferable all at once, wafer transfer can be performed between the containers in the apparatus without lowering transfer throughput.

In the above embodiment, the dual-arm robot having the end effector for transferring a single wafer and the end effector for transferring two wafers were described. The embodiment shown here is just one example of the present invention. The present invention can apply to an arm robot having N end effectors, wherein N is any integer of two or more. In this case, N end effectors used can be made up with end effectors for a single wafer, for M−1 wafers, for M−2 wafers . . . (M−(N−1)) wafers, wherein M is a maximum number of wafers transferable by N end effectors all at once.

As described above, even when three or more end effectors are used, high transfer throughput can be achieved according to an embodiment of the present invention.

Figure 5:
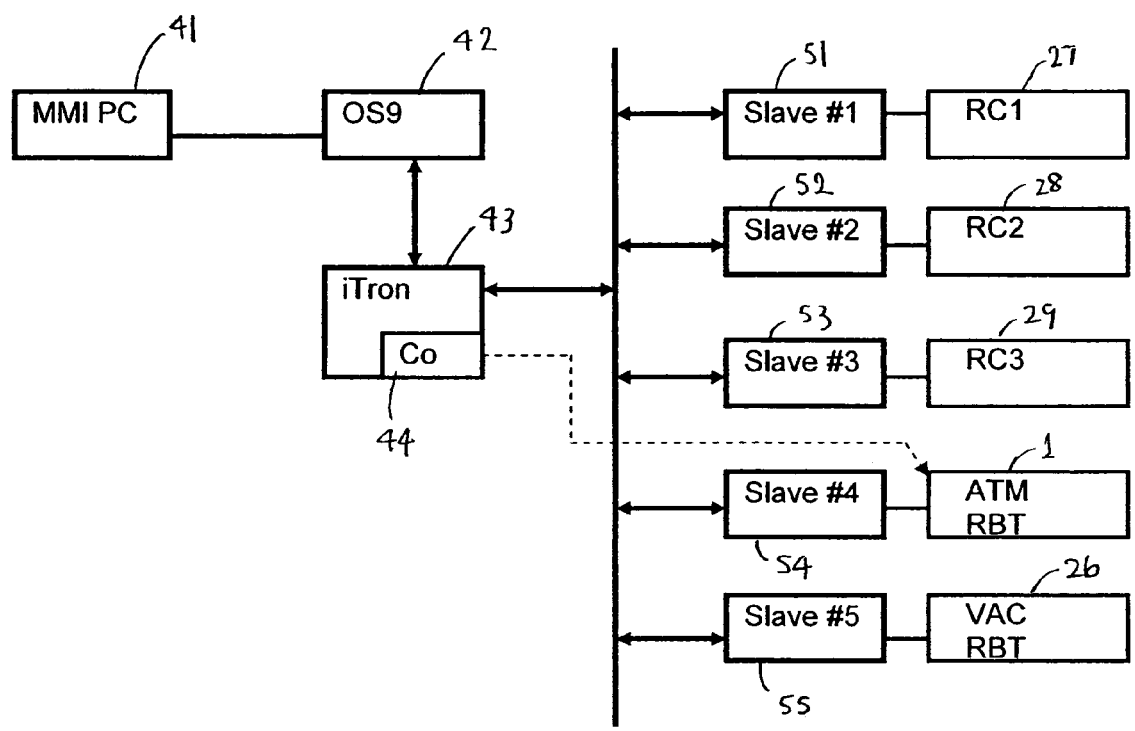
FIG. 5 is a schematic diagram showing a control system of a semiconductor substrate processing apparatus and a substrate transfer apparatus according to an embodiment of the present invention.

FIG. 5 is a schematic diagram showing a control system of a semiconductor substrate processing apparatus and a substrate transfer apparatus according to an embodiment of the present invention. Setting of system recipes, process recipes, etc. can be performed through MMI PC (Man Machine Interfaces PC for display) 41. Information from MMI PC41 is sent to a CPU board for communication with MMI PC (OS9) 42, and is then inputted into a CPU board 43 as a main controller (iTron). The iTron 43 instructions slave boards 51 to 55 to execute recipes (e.g., process recipes) according to the system recipe. In this embodiment, Slave #1 (51) controls a reaction chamber (RC1) 27; Slave #2 (52) controls a reaction chamber (RC2) 28; Slave #3 controls a reaction chamber (RC3) 29; Slave #4 controls an atmospheric robot (ATM RBT) 1; and Slave #5 controls a vacuum robot (VAC RBT) 26.

In the above, a controller (Co) 44 storing software including instructions to judge which end effector or end effectors (e.g., one of or both of the end effectors 4 and 5) of the ATM RBT 1 are to be selected based on a distribution status of wafers stored in the wafer-storing container 21/22 and the wafer I/O container 23/24 and to rotate the selected end effector(s) for unloading a wafer or wafers from the wafer-storing container 21/22 or the wafer I/O container 23/24 and loading the wafer or wafers to the wafer I/O container 23/24 or the wafer-storing container 21/22 (the broken line between the Co 44 and the ATM RBT 1 in FIG. 5). The software is programmed to execute the flowcharts shown in FIGS. 3 and 4, for example. The distribution status of wafers includes an occupancy status of wafers in a transfer origin (e.g., the wafer-storing container 21/22 or the wafer I/O container 23/24) and an empty status of wafers in a transfer destination (e.g., the wafer I/O container 23/24 or the wafer-storing container 21/22), which status can be obtained by the laser beam sensing system shown in FIGS. 6(A)-6(C), for example. The signals outputted by the laser beam sensing system are inputted into the Co 44.

Figure 6A:
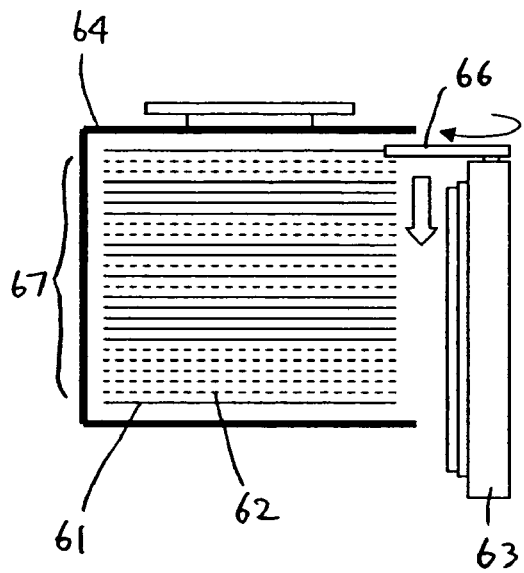
FIGS. 6(A)-6(C) are schematic diagrams showing a wafer storing container equipped with a sensor device usable in an embodiment of the present invention.
Figure 6B:
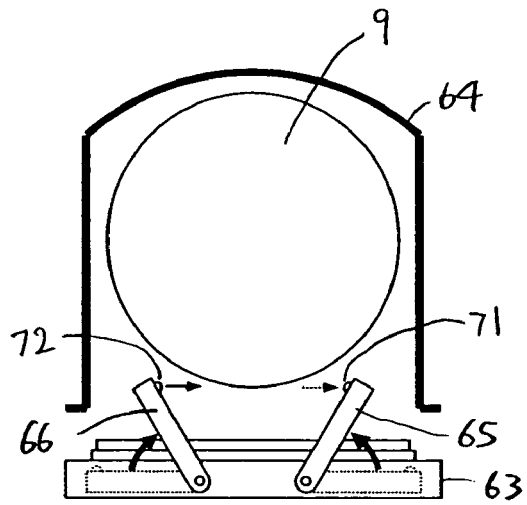
Figure 6C:
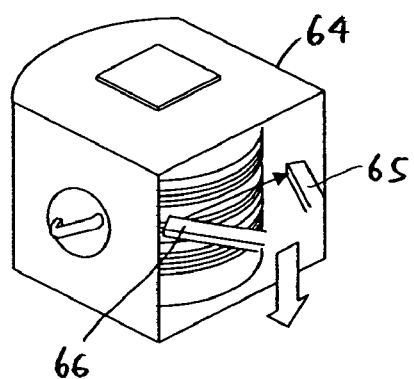

FIGS. 6(A)-6(C) are schematic diagrams showing a wafer storing container (front opening unified pod, FOUP) equipped with a sensor device usable in an embodiment of the present invention. FIG. 6(A) is a side cross sectional view, FIG. 6(B) is a top cross sectional view, and FIG. 6(C) is a perspective view. This FOUP corresponds to the wafer storing container 21, 22 shown in FIG. 2. The FOUP is composed of a container body 64, a door 63, and slots 67. The door is equipped with a sensing device 65, 66 on it top (FIG. 6(A)). The sensing device is composed of a rotatable support 66 with a laser beam emitter 72 and a rotatable support 65 with a laser beam receptor 71 (FIG. 6(B)). One end of the support 66 is rotatably fixed to the top side of the door 63, and another end of the support 66 is provided with the laser beam emitter 72. Also, one end of the support 65 is rotatably fixed to the top side of the door 63, and another end of the support 65 is provided with the laser beam receptor 71. The rotatable supports 65, 66 are aligned along with the top side of the door 63 when at a home position. When the door 63 moves downward to open, the rotatable supports 65, 66 rotate in opposite directions so that the laser beam emitter 72 and the laser beam receptor 71 face each other without contacting wafers 9 (FIG. 6(B)). In the position (scanning position), a laser beam emitted from the laser beam emitter 72 is received by the laser beam receptor 71 if no wafer is placed in a slot; whereas a laser beam emitted from the laser beam emitter 72 is blocked by a wafer and is not received by the laser beam receptor 71 if the wafer is placed in a slot, thereby judging whether each slot is occupied or empty.

As the door 63 descends, the laser beam emitter 72 and the laser beam receptor 71 scan each slot consecutively to determine an occupancy status or an empty status of the slots (FIGS. 6(A) and 6(C)). When the FOUP serves as a transfer origin (i.e., unprocessed wafers are transferred from the FOUP to an IOC (in-out chamber)), the occupancy status of the slots of the FOUP is detected. When the FOUP serves as a transfer destination (i.e., processed wafers are transferred from the IOC to the FOUP), the empty status of the slots of the FOUP is detected. This information is transmitted to the Co 44 in the iTron 43 shown in FIG. 5.

Sensing devices are not limited to the above laser beam sensing system but can be any suitable sensing system which one of ordinary skill in the art could readily provide.

In an embodiment, the occupancy status and the empty status of slots of an IOC can be detected in a similar manner, except that a laser beam sensing system is not provided in a gate but is fixed inside the IOC. The slots of the IOC move vertically so that a vacuum robot can be positioned to loading and unloading a wafer to and from the IOC. When the slots move vertically, the fixed sensing system senses the presence of a wafer in each slot.

In the present disclosure where conditions and/or structures are not specified, the skilled artisan in the art can readily provide such conditions and/or structures, in view of the present disclosure, as a matter of routine experimentation.

The present invention includes the above mentioned embodiments and other various embodiments including the following:

1) A semiconductor substrate transfer apparatus comprising: (i) at least one arm, and (ii) N end effectors (N is any integer of two or more) rotatably joined with said arm, each of which holds at least one semiconductor substrate, which is characterized in that at the start of a substrate transfer process, at least one desired end effector is selected from said N end effectors according to a substrate distribution status in a transfer origin and an empty slot status in a transfer destination, the selected end effector and an unselected end effector rotate independently of each other in respect to said arm, and a semiconductor substrate is transferred by the selected end effector.

2) The substrate transfer apparatus according to Item 1, wherein one of said N end effectors holds only one semiconductor substrate, and the remaining N−1 end effector holds plural semiconductor substrates.

3) The substrate transfer apparatus according to Item 1 or 2, which further comprises a rotating mechanism, and wherein a rotational motion of said end effectors is performed by said rotating mechanism.

4) The substrate transfer apparatus according to Item 3, wherein N equals 2, and said end effectors comprise a first end effector and a second end effector.

5) The substrate transfer apparatus according to Item 4, wherein said first end effector holds one semiconductor substrate, and said second end effector holds two semiconductor substrates.

6) The substrate transfer apparatus according to Item 5, wherein when two semiconductor substrates are transferred, said first effector rotates and retracts; when one semiconductor substrate is transferred, said second end effector rotates and retracts.

7) The substrate transfer apparatus according to any one of Item 1 to Item 6, wherein said end effectors are composed of ceramics.

8) The substrate transfer apparatus according to any one of Item 1 to Item 6, wherein said end effectors are composed of carbon fiber.

9) A program for controlling a semiconductor substrate transfer apparatus comprising at least one arm and N (N is any integer of two or more) end effectors rotatably joined with said arm, each of which holds at least one semiconductor substrate, which executes the following tasks:

(1) In response to a command notifying of a substrate distribution status in a transfer origin, an evaluation result of whether M (M is a maximum number of semiconductor substrates transferable by N end effectors at a time) or more consecutive empty slots exist in a transfer destination or not is outputted, (2) If M or more consecutive empty slots exist in the transfer destination from the result outputted in (1), an evaluation result of whether semiconductor substrates exist in M or more consecutive slots in the transfer origin or not is outputted, (3) If M or more consecutive empty slots do not exist in the transfer destination from the result outputted in (1), an evaluation result of whether M−1 consecutive empty slots exist in the transfer destination or not is outputted, (4) If semiconductor substrates exist in M or more consecutive slots in the transfer origin from the result outputted in (2), an instruction to select an end effector for M−1 pieces and an end effector for a single piece and transfer M semiconductor substrates to the slots in the transfer destination using the selected end effectors is outputted, (5) If semiconductor substrates do not exist in M or more consecutive slots in the transfer origin from the result outputted in (2), or if M−1 consecutive empty slots exist in the transfer destination from the result outputted in (3), an evaluation result of whether semiconductor substrates exist in M−1 slots in the transfer origin or not is outputted, (6) If M−1 consecutive empty slots do not exist in the transfer destination from the result outputted in (3), an evaluation result of whether one empty slot exists in the transfer origin or not is outputted, (7) If semiconductor substrates exist in M−1 consecutive slots in the transfer origin from the result outputted in (5), an instruction to select an end effector for M−1 pieces and rotate and retract end effectors other than the selected is outputted, and an instruction to transfer M−1 semiconductor substrates to the slots in the transfer destination using the end effector for M−1 pieces is outputted, (8) If semiconductor substrates do not exist in M−1 consecutive slots in the transfer origin from the result outputted in (5), or if one empty slot exists in the transfer destination from the result outputted in (6), an evaluation result of whether one empty slot exists in the transfer origin or not is outputted, (9) If one semiconductor substrate exists in the transfer origin from the result outputted in (8), an instruction to select an end effector for a single piece and rotate and retract the other end effectors is outputted, and an instruction to transfer one semiconductor substrate to the slot in the transfer destination using the selected end effector for a single piece is outputted.

10) The program according to Item 9, wherein said transfer origin is a wafer-storing container and said transfer destination is a wafer I/O container.

11) The program according to Item 9, wherein said transfer origin is a wafer I/O container and said transfer destination is a wafer-storing container.

12) The program according to Item 9, wherein N equals two and M equals three.

13) A semiconductor processing apparatus, which comprises: (i) at least one reaction chamber, a load lock chamber, a wafer I/O container disposed inside said load lock chamber, a wafer-storing container for storing semiconductor substrates, the substrate transfer apparatus according to any one of Item 1 to Item 8, a laser sensor for evaluating a semiconductor substrate distribution status inside the wafer-storing container, and the control means for executing the program according to Item 9.

14) The semiconductor processing apparatus according to Item 13, wherein said control means comprises a computer software program.

15) The semiconductor processing apparatus according to Item 13, wherein the number of said reaction chambers and the number of wafers which can be stored in said wafer I/O container are a multiple of a maximum number of wafers transferable when all end effectors are used.

16) A semiconductor substrate transfer system, which comprises a substrate transfer apparatus comprising a first end effector holding one semiconductor substrate, a second end effector holding M−1 (M is a maximum number of semiconductor substrates transferable by said first end effector and said second end effector at a time) semiconductor substrates, a first arm supporting said first end effector and said second end effector, a rotating mechanism, and a second arm one end of which is rotatably joined with the first arm and the other end of which is connected with the rotating mechanism; an evaluation apparatus provided in a mounting stage of a storing container for storing said semiconductor substrates for evaluating said semiconductor substrate distribution status inside said storing container by a laser emitting element and a light receiving element and outputting a result; and a control means having a processor and memory and for controlling motions of said first end effector and said second end effector, which is characterized in that motions of said first end effector and said second end effector are controlled by execution of a program stored in said memory; said control is to select at least one end effector to be used based on evaluation information outputted from said evaluation apparatus and to activate said rotating mechanism so as to rotate and retract an unselected end effector in respect to said first arm and independently of the selected end effector.

17) The semiconductor substrate transfer system according to Item 16, wherein by execution of said program, if said first end effector is selected from said substrate distribution information, said second end effector is rotated and retracted in respect to said first arm independently of said first end effector.

18) The semiconductor substrate transfer system according to Item 16, wherein by execution of said program, if said second end effector is selected from said substrate distribution information, said first end effector is rotated and retracted in respect to said first arm independently of said second end effector.

19) The semiconductor substrate transfer system according to Item 16, wherein M equals three.

The present application claims priority to Japanese Patent Application No. 2005184365, filed Jun. 24, 2005, the disclosure of which is incorporated herein by reference in its entirety.

It will be understood by those of skill in the art that numerous and various modifications can be made without departing from the spirit of the present invention. Therefore, it should be clearly understood that the forms of the present invention are illustrative only and are not intended to limit the scope of the present invention.

What is claimed is:

1. A semiconductor substrate transfer apparatus for transferring semiconductor substrates from a first container to a second container, comprising:

multiple end effectors for unloading substrates from the first container and loading the substrates to the second container, one of said multiple end effectors being configured to hold at least one substrate, another of said multiple end effectors being configured to hold more substrates than the one of said multiple end effectors;

at least one robot arm for moving the multiple end effectors from the first container to the second container, wherein the at least one robot arm comprises a first arm and a second arm wherein the one of said multiple end effectors and the another of said multiple end effectors have a common axis disposed therein and are co-axially and rotatably joined at the common axis with the second arm which is rotatably joined with the first arm, and the first arm has a support axis rotatably fixed to a base and common to the one of said multiple end effectors and the another of said multiple end effectors, wherein the one of the multiple end effectors and the another of the multiple end effectors are independently rotatable at the common axis with respect to the second arm;

a controller for judging which end effector or end effectors in the multiple end effectors are to be selected based on a distribution status of substrates stored in the first and second containers and for rotating the selected end effector(s) for unloading a substrate or substrates from the first container and loading the substrate or substrates to the second container; and a sensor device for sensing an occupancy status of slots of the first container, which is used as the distribution status by the controller, wherein the sensor device is installed in a door of the first container and is configured to sense the occupancy status of slots when the door opens.

2. The semiconductor substrate transfer apparatus according to claim 1, wherein the multiple end effectors are two end effectors.

3. The semiconductor substrate transfer apparatus according to claim 1, wherein the one of the multiple end effectors is configured to hold one substrate, and the other of the multiple end effectors is configured to hold two substrates.

4. The semiconductor substrate transfer apparatus according to claim 1, wherein the controller instructs the selected end effector(s) to rotate for unloading a substrate or substrates from the first container and instruct the non-selected end effector(s), if any, to be retracted so as not to contact the substrate or substrates.

5. The semiconductor substrate transfer apparatus according to claim 1, wherein the distribution status includes an occupancy status of substrate slots of the first container and an empty status of substrate slots of the second container.

6. The semiconductor substrate transfer apparatus according to claim 5, wherein the controller judges which end effector or end effectors in the multiple end effectors are to be selected based on the distribution status of substrates, wherein the end effector(s) is/are selected which can simultaneously hold a maximum number of substrates which is the same as or smaller than the number of consecutive empty slots of the second container and the number of consecutive occupied slots of the first container.

7. The semiconductor substrate transfer apparatus according to claim 1, which is configured to be disposed between a front opening unified pod (FOUP) as the first container and an in-out chamber (IOC) as the second container.

8. The semiconductor substrate transfer apparatus according to claim 1, which is configured to be disposed between an in-out chamber (JOC) as the first container and a front opening unified pod (FOUP) as the second container.

9. The semiconductor substrate transfer apparatus according to claim 1, wherein the maximum number of substrates which can be held simultaneously by the multiple end effectors is a factor of the number of slots provided in the first container and/or the second container.

10. The semiconductor substrate transfer apparatus according to claim 1, wherein the one of the multiple end effectors and the another of the multiple end effectors have the same shape as viewed above the multiple end effectors.

11. The semiconductor substrate transfer apparatus according to claim 1, wherein the sensor device is installed on a top side of the door which is structured to move downward to open.

12. The semiconductor substrate transfer apparatus according to claim 11, wherein the sensor device is rotatably fixed to the top side of the door wherein the sensor device is aligned along with the top side of the door as a home position and rotates to a sensing position for sensing the occupancy status of slots while the door is moving downward to open.

13. A semiconductor substrate transfer system comprising:
(a) at least one front opening unified pod (FOUP) for storing substrates;
(b) at least one in-out chamber (JOC) for storing substrates; and
(c) a semiconductor substrate transfer apparatus disposed between the front opening unified pod and the in-out chamber, for transferring substrates between the front opening unified pod and the in-out chamber, said semiconductor substrate transfer apparatus comprising:

multiple end effectors for unloading substrates from the front opening unified pod and loading the substrates to the in-out chamber and for unloading substrates from the in-out chamber and loading the substrates to the front opening unified pod, one of said multiple end effectors being configured to hold at least one substrate, another of said multiple end effectors being configured to hold more substrates than the one of said multiple end effectors;

at least one robot arm for moving the multiple end effectors between the front opening unified pod and the in-out chamber, wherein the at least one robot arm comprises a first arm and a second arm wherein the one of said multiple end effectors and the another of said multiple end effectors have a common axis disposed therein and are co-axially and rotatably joined at the common axis with the second arm which is rotatably joined with the first arm, and the first arm has a support axis rotatably fixed to a base and common to the one of said multiple end effectors and the another of said multiple end effectors, wherein the one of the multiple end effectors and the another of the multiple end effectors are independently rotatable at the common axis with respect to the second arm;

a controller for judging which end effector or end effectors in the multiple end effectors are to be selected based on a distribution status of substrates stored in the front opening unified pod and the in-out chamber and for rotating the selected end effector(s) for unloading a substrate or substrates from the front opening unified pod and loading the substrate or substrates to the in-out chamber or for unloading a substrate or substrates from the in-out chamber and loading the substrate or substrates to the front opening unified pod; and a sensor device for sensing an occupancy status of slots of the front opening unified pod, which is used as the distribution status by the controller, wherein the sensor device is installed in a door of the front opening unified pod and is configured to sense the occupancy status of slots when the door opens.

14. The semiconductor substrate transfer system according to claim 13, wherein the multiple end effectors are two end effectors, and the one of the multiple end effectors is configured to hold one substrate, and the other of the multiple end effectors is configured to hold two substrates.

15. The semiconductor substrate transfer system according to claim 13, wherein the maximum number of substrates which can be held simultaneously by the multiple end effectors is a factor of the number of slots provided in the front opening unified pod and/or the in-out chamber.

16. A semiconductor substrate processing apparatus comprising:
(a) at least one front opening unified pod (FOUP) for storing substrates;
(b) at least one in-out chamber (IOC) for storing substrates;
(c) a semiconductor substrate transfer apparatus disposed between the front opening unified pod and the in-out chamber, for transferring substrates between the front opening unified pod and the in-out chamber, said semiconductor substrate transfer apparatus comprising:
multiple end effectors for unloading substrates from the front opening unified pod and loading the substrates to the in-out chamber and for unloading substrates from the in-out chamber and loading the substrates to the front opening unified pod, one of said multiple end effectors being configured to hold at least one substrate, another of said multiple end effectors being configured to hold more substrates than the one of said multiple end effectors;

at least one robot arm for moving the multiple end effectors between the front opening unified pod and the in-out chamber, wherein the at least one robot arm comprises a first arm and a second arm wherein the one of said multiple end effectors and the another of said multiple end effectors have a common axis disposed therein and are co-axially and rotatably joined at the common axis with the second arm which is rotatably joined with the first arm, and the first arm has a support axis rotatably fixed to a base and common to the one of said multiple end effectors and the another of said multiple end effectors, wherein the one of the multiple end effectors and the another of the multiple end effectors are independently rotatable at the common axis with respect to the second arm;

a controller for judging which end effector or end effectors in the multiple end effectors are to be selected based on a distribution status of substrates stored in the front opening unified pod and the in-out chamber and for rotating the selected end effector(s) for unloading a substrate or substrates from the front opening unified pod and loading the substrate or substrates to the in-out chamber or for unloading a substrate or substrates from the in-out chamber and loading the substrate or substrates to the front opening unified pod; and a sensor device for sensing an occupancy status of slots of the front opening unified pod, which is used as the distribution status by the controller, wherein the sensor device is installed in a door of the front opening unified pod and is configured to sense the occupancy status of slots when the door opens;

(d) at least one reaction chamber for processing substrates; and
(e) a vacuum robot disposed between the in-out chamber and the reaction chamber.

17. The semiconductor substrate processing apparatus according to claim 16, wherein the maximum number of substrates which can be held simultaneously by the multiple end effectors is a factor of the number of slots provided in the front opening unified pod and/or the in-out chamber.

18. The semiconductor substrate processing apparatus according to claim 16, wherein the maximum number of substrates which can be held simultaneously by the multiple end effectors is a factor of the number of slots provided in the in-out chamber and the number of the reaction chambers.

* * * * *

UNITED STATES PATENT AND TRADEMARK OFFICE
CERTIFICATE OF CORRECTION

PATENT NO. : 7,618,226 B2 Page 1 of 1
APPLICATION NO. : 11/445035
DATED : November 17, 2009
INVENTOR(S) : Takizawa et al.

It is certified that error appears in the above-identified patent and that said Letters Patent is hereby corrected as shown below:

Title page; item (56);
At Page 1, Column 2 (Foreign Patent Documents), Line 16, delete "2001-50159 A" and insert -- 2001-501597 A --, therefor.

At Column 11, Lines 33-34, delete "Interfaces" and insert -- Interface --, therefor.

At Column 16, Line 24, delete "(JOC)" and insert -- (IOC) --, therefor.

At Column 16, Line 48, delete "(JOC)" and insert -- (IOC) --, therefor.

Signed and Sealed this

Fifteenth Day of June, 2010

David J. Kappos
*Director of the United States Patent and Trademark Office*